(12) United States Patent
Nicolai et al.

(10) Patent No.: US 7,319,594 B2
(45) Date of Patent: Jan. 15, 2008

(54) ASSEMBLY OF DEVICES

(75) Inventors: Michael Nicolai, Rabenau (DE);
Martin Dörrich, Mittenaar (DE)

(73) Assignee: Rittal GmbH & Co. KG, Herborn (DE)

( * ) Notice: Subject to any disclaimer, the term of this patent is extended or adjusted under 35 U.S.C. 154(b) by 0 days.

(21) Appl. No.: 10/573,284

(22) PCT Filed: Jan. 29, 2005

(86) PCT No.: PCT/EP2005/000895

§ 371 (c)(1),
(2), (4) Date: Mar. 23, 2006

(87) PCT Pub. No.: WO2005/081091

PCT Pub. Date: Sep. 1, 2005

(65) Prior Publication Data

US 2007/0081302 A1    Apr. 12, 2007

(30) Foreign Application Priority Data

Feb. 17, 2004 (DE) .................... 10 2004 008 460

(51) Int. Cl.
*H05K 5/00* (2006.01)
*H05K 7/20* (2006.01)
*F28D 15/00* (2006.01)

(52) U.S. Cl. ............... 361/724; 361/694; 361/695; 361/701; 165/80.3; 165/80.4; 165/104.33

(58) Field of Classification Search ............ 361/608, 361/676–678, 690–695, 699, 701, 720–721, 361/724, 687; 165/80.3–80.4; 62/186, 259.2; 454/184

See application file for complete search history.

(56) References Cited

U.S. PATENT DOCUMENTS 3,396,780 A * 8/1968 Koltuniak et al. ............ 165/47

(Continued)

FOREIGN PATENT DOCUMENTS

DE            3405243 A1 *   8/1985

(Continued)

*Primary Examiner*—Jayprakash Gandhi
*Assistant Examiner*—Robert J. Hoffberg
(74) *Attorney, Agent, or Firm*—Pauley Petersen & Erickson

(57) ABSTRACT

An assembly of devices including at least one switchgear cabinet and a cooling device. The switchgear cabinet has a closed interior, in which electric installations can be housed. The cooling device is attached in the vicinity of or near a lateral surface of the switchgear cabinet that runs vertically with respect to the front face, extending at least over part of the height of the switchgear cabinet and having a spatial connection with the interior via at least one air inlet and at least one vent outlet. The cooling device includes a receiving chamber that houses at least one heat exchanger. This invention facilitates the adaptation of the cooling device in superstructures of this type to modified cooling requirements. To achieve this, at least sections of the receiving chamber of the cooling device are divided into two or more receiving sub-chambers that are situated one above the other and a cooling module is housed in at least one of the receiving sub-chambers.

15 Claims, 2 Drawing Sheets

U.S. PATENT DOCUMENTS

| | | |
|---|---|---|
| 3,749,981 A | 7/1973 | Koltuniak et al. |
| 4,123,129 A * | 10/1978 | Butler ............... 312/265.3 |
| 5,747,734 A * | 5/1998 | Kozlowski et al. ........ 174/50 |
| 6,109,053 A | 8/2000 | Strackbein et al. |
| 6,775,137 B2 * | 8/2004 | Chu et al. ................ 361/696 |
| 6,924,981 B2 * | 8/2005 | Chu et al. ................ 361/696 |
| 6,962,191 B2 * | 11/2005 | Immel et al. ............. 165/54 |

FOREIGN PATENT DOCUMENTS

| | | |
|---|---|---|
| DE | 88 07 768.3 | 1/1989 |
| DE | 198 05 394 C2 | 7/2002 |
| DE | 101 12 389 A1 | 10/2002 |
| DE | 102 10 658 C1 | 11/2003 |

* cited by examiner

ASSEMBLY OF DEVICES

BACKGROUND OF THE INVENTION

1. Field of the Invention

This invention relates to a device arrangement with at least one switchgear cabinet and one cooling device, wherein the switchgear cabinet has a closed interior in which electrical built-ins can be housed, the cooling device is installed in the area of a lateral surface of the switchgear cabinet which extends vertically with respect to the front and at least over a portion of the height of the switchgear cabinet, and is in spatial connection with the interior through at least one air inlet and at least one venting opening, and the cooling device has a receiving chamber in which at least one heat exchanger is housed.

2. Discussion of Related Art

A device arrangement is known from the company catalog of Rittal, Manual 30, page 448. In this case the cooling device has a closed housing, which can be installed on the switchgear cabinet in place of a door or a lateral wall. A heat exchanger is placed into the housing, which is in a spatial connection with the interior of the switchgear cabinet. Air is drawn off the ceiling area of the switchgear cabinet, is cooled in the heat exchanger and is supplied to it again in the floor area. For reasons of space, the interiors of switchgear cabinets are increasingly more densely packed. Thus, a larger amount of waste heat is generated, which must be removed. With equipment of such a type, the cooling device must be exchanged for a device with higher cooling output.

SUMMARY OF THE INVENTION

It is one object of this invention to provide a device arrangement of the type mentioned above but which can be easily adapted to changing cooling demands.

This object is achieved with a receiving chamber of the cooling device divided at least partially into two or more partial receiving chambers, which are arranged vertically on top of each other. A cooling module is housed in at least one of the partial receiving chambers.

The receiving chamber of the cooling device is embodied such that it can be modularly equipped with one or several heat exchanger units. Thus the cooling device can be individually matched to increasing demands. The receiving chamber of the air-conditioning device is vertically divided. In this case zones can be formed as required, by which cooling areas, which are analogously placed on top of each other, can be created in the interior of the switchgear cabinet. It is thus possible to prevent areas of a high thermal level being created by rising heat.

A defined air guidance can be simply achieved if on their side facing the switchgear cabinet, the partial receiving chambers are closed by a cover. The cover forms the air inlet and the venting opening, and a sealing element arranged on the outside of the cover in the area between the air inlet and the venting opening prevents a short circuit of the air.

If the cooling module has a heat exchanger unit and at least one fan unit as separate components, the cooling module can be easily manipulated. This is particularly advantageous in case of tight spaces. For example, a walkway of a width of only 80 cm is formed between switchgear cabinets in computer centers. With this invention the cooling module can be easily put together from its components in the partial receiving chambers.

A stable construction of the cooling devices results if the cooling device has a rack put together from horizontal and vertical profiled frame elements, wherein the profiled frame elements are connected with each other in the corners of the rack. Component floors are horizontally fastened on the rack for dividing the partial receiving chamber, and each cooling module can be placed on the compartment floors. If the cooling module or the partial components have a structural width which is less than the clear opening dimension between the two vertical profiled frame elements at the front of the rack, then the cooling module can be installed from the front of the device and/or the rear. This is of particular advantage if there is no, or only insufficient, lateral access to the cooling device provided because of limited space.

A structural variation of the device arrangement can be designed, for example, so that on its side facing away from the switchgear cabinet, the cooling device is sealingly closed off by a wall element.

However, it is also possible for the cooling device to be installed between two switchgear cabinets. The partial receiving chambers can be selectively brought into an air-conducting connection with the interior chambers of one or both switchgear cabinets. Thus it is possible to air-condition two switchgear cabinets simultaneously with a single cooling device.

In one embodiment of this invention, the cooling device has a feed and a return line, through which coolant can be conveyed, and the heat exchanger units can be connected to the feed and the return lines. The feed and return lines can be connected, for example, to an external re-cooling installation. The supply of the heat exchanger units with cooling output is thus solved in a simple way.

If the feed and return lines have rapid coupling devices, which can be connected and disconnected without dripping, specialists are not absolutely required for connecting the cooling modules.

In one embodiment of this invention, the electrical installations are server units, which have cooling conduit structures extending in the direction of the switchgear cabinet interior. The venting opening of the cooling conduit structure is assigned to the front of the switchgear cabinet, and the air inlet is assigned to the area of the rear of the switchgear cabinet.

BRIEF DESCRIPTION OF THE DRAWINGS

This invention is explained in view of exemplary embodiments represented in the drawings, wherein.

DESCRIPTION OF PREFERRED EMBODIMENTS

Figure 1:
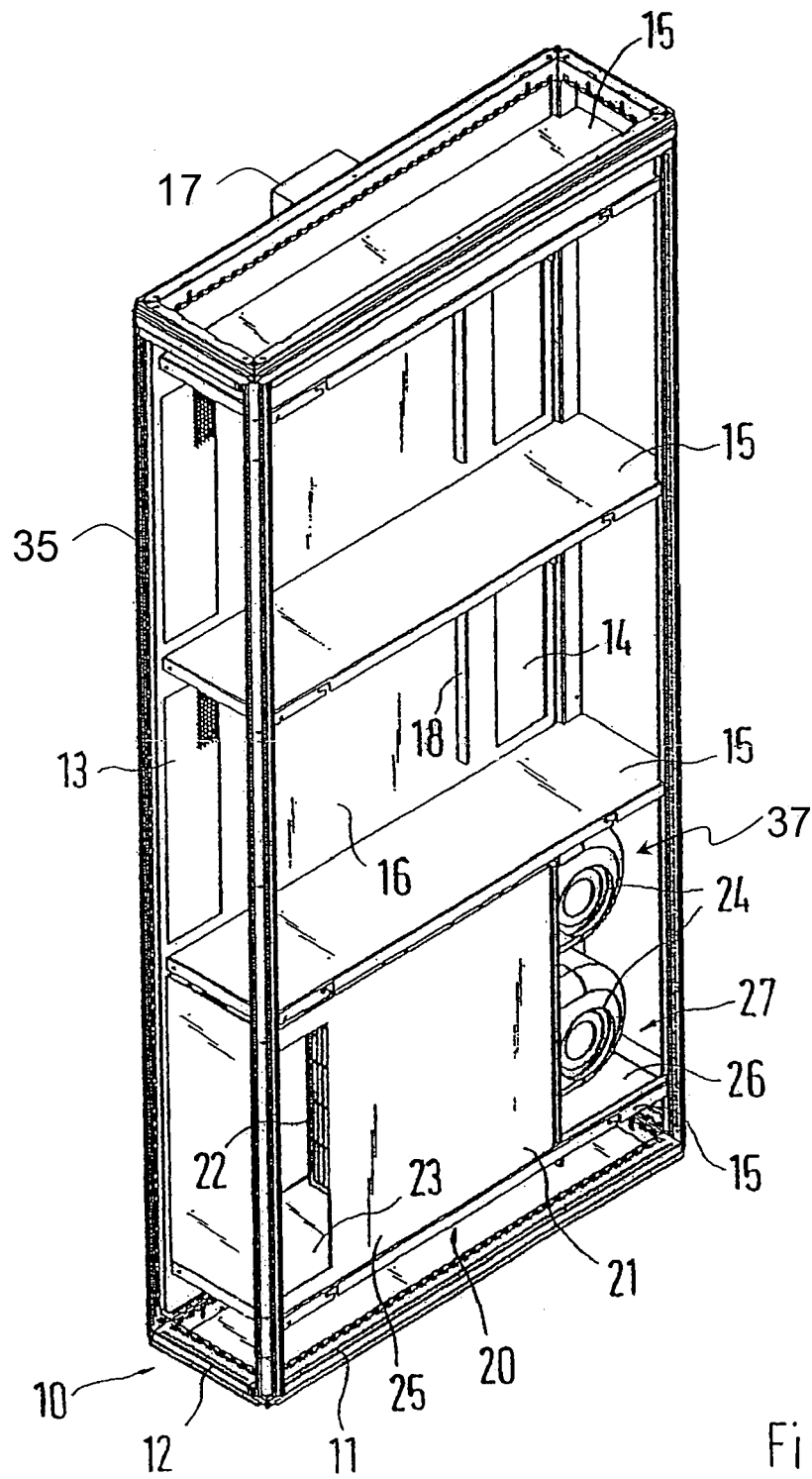
FIG. 1 shows a cooling device in a perspective lateral view.

A cooling device 10 with a rack is represented in FIG. 1, and is put together from twelve profiled frame elements 11, 12, 35. The horizontal profiled frame elements 11, 12 form a bottom and cover frame, into whose corner areas the four vertical profiled frame elements 35 of identical cross section are welded. The receiving chamber formed by the rack is divided into three partial receiving chambers by horizontal compartment floors 15. The partial receiving chambers can be covered on both sides by lateral covers 16, and have cooling conduit structures 36. Each of the lateral covers 16 has an air inlet 14, a venting opening 13 and a sealing element 17. The narrow sides at the front and rear, as well as the roof, of the rack 15 are covered by suitable panels. The compartment floors 15 are fastened at the vertical profiled frame element 35 and each is used for receiving a cooling module 20. In this case, each cooling module is put together from two components, a heat exchanger unit 21 and a fan unit 37 wherein fan unit 37 includes at least one fan 24.

The heat exchanger unit 21 has a heat exchanger housing 25, into which an air-water heat exchanger 22 is inserted. The heat exchanger housing 25 has two outlet openings 23, which can be aligned with the venting opening 13 of the covers 16.

The fan unit 32 has a fan housing 26, which receives two fans 24. The fan housing 26 is in an air-conducting connection via its open sides 27 with the air inlets 14 of the covers 16.

For mounting the cooling module 20, the heat exchanger unit 21 is pushed through the open front of the rack between the two vertical profiled frame elements 35 on the compartment floor 15 into the assigned partial receiving chamber until the heat exchanger housing 25 limits the insertion movement at a stop 18 of the covers 16. In the same way, a fan unit 37 is pushed on the compartment floor 15 which is used as a sliding guide into the partial receiving chamber from the direction of the rear of the rack. Again, the stop 18 limits the insertion movement.

Figure 2:
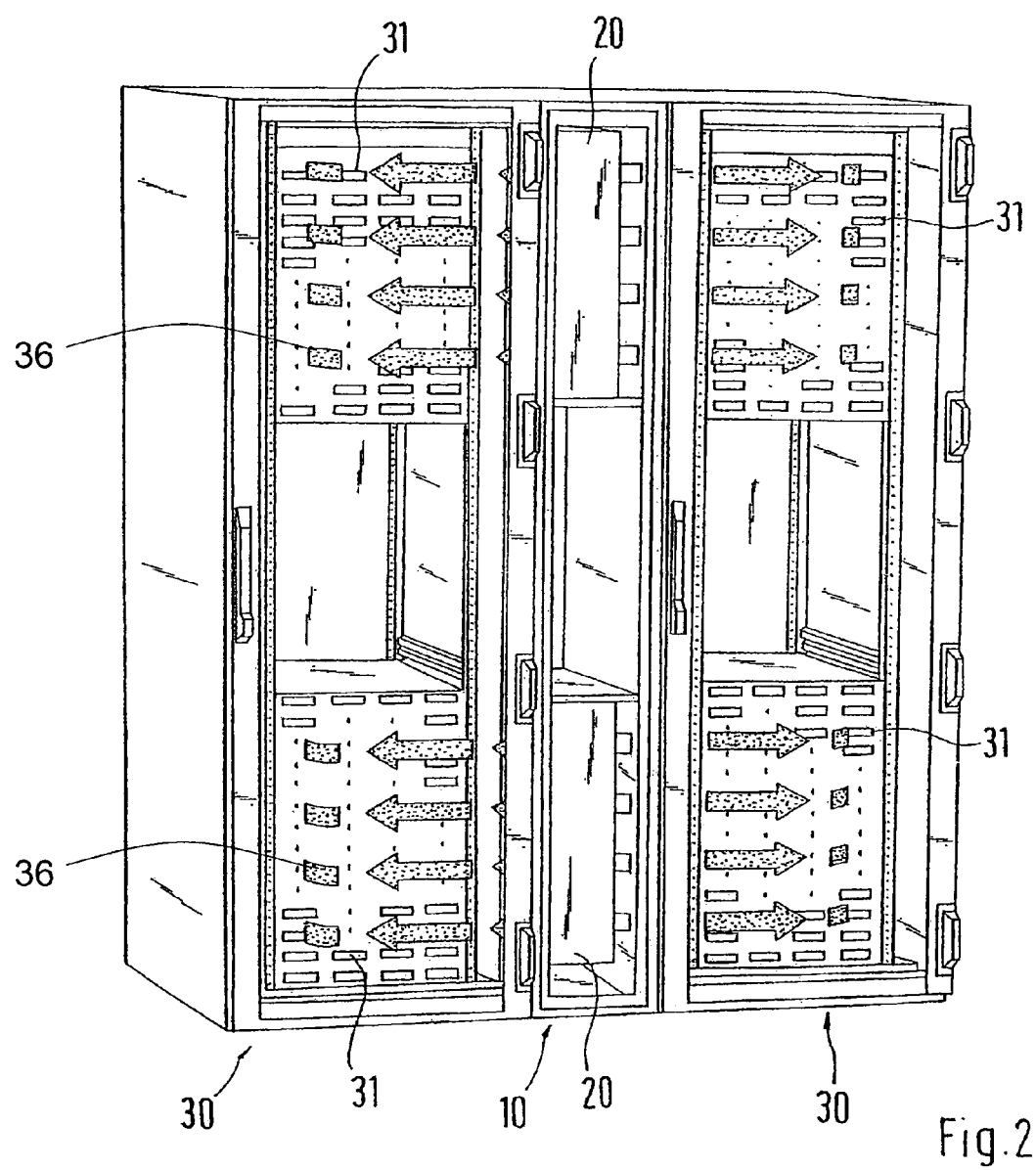
FIG. 2 shows a perspective view of a device arrangement including two switchgear cabinets and the air-conditioning device represented in FIG. 1.

The cooling device 10 represented in FIG. 1 can be installed in a device arrangement such as shown, for example, in FIG. 2. Here, the cooling device 10 is installed between two switchgear cabinets 30. The switchgear cabinets 30 have a conventional structure and have a frame screened by wall elements and a door at the front. The cooling device 10 replaces the wall element at the switchgear cabinet sides facing each other.

As shown in the drawings, the switchgear cabinets 30 are each equipped with two server units, electrical built-ins 31. In this case, one server unit each is arranged in the roof and the bottom areas of the switchgear cabinet 30. An empty space exists between the two server units which can be equipped, when needed, with a third server unit for completing the interior of the switchgear cabinet.

Corresponding to the occupation of the switchgear cabinet 30, the cooling device 10 contains two cooling modules 20. Each of the cooling modules 20 is in spatial connection with the interiors of both switchgear cabinets via the air inlets 14 and the exhaust openings 23. Air can be conveyed in the direction toward the switchgear cabinet interior by the fan units 24 over a conduit structure of the server units. This air is cooled in the heat exchanger 22 of the heat exchanger unit 21 and is then again conducted to the conduit structure in the area of the front of the switchgear cabinets 30 through the venting openings 13. If at a later time the switchgear cabinets 30 are retrofitted with a third server unit, it is possible in a simple manner to also retrofit a third cooling module 20 in the cooling device 10.

If only one server unit is retrofitted in one switchgear cabinet 30, a cover 16 which does not permit the passage of air is installed toward the other switchgear cabinet 30. It is thus possible to adapt all partial receiving chambers to the respective individual installation conditions in the switchgear cabinet 30.

The cooling device can also be installed by itself in only one switchgear cabinet. The side of the cooling device facing away from the switchgear cabinet 30 is then closed off by a lateral wall.

The invention claimed is:

1. A device arrangement with at least one switchgear cabinet and one cooling device, wherein the switchgear cabinet has a closed interior in which electrical built-ins are housed, the cooling device is installed in an area of a lateral surface of the switchgear cabinet adjacent to the lateral surface which extends vertically with respect to a front of the switchgear cabinet and at least over a portion of the height of the switchgear cabinet, and is in spatial connection with the interior through at least one air inlet and at least one venting opening, and wherein the cooling device has a receiving chamber in which at least one heat exchanger is housed, the device arrangement comprising:

the receiving chamber of the cooling device (10) divided at least partially into two or more partial receiving chambers, arranged vertically on top of each other, and a cooling module (20) housed in at least one of the partial receiving chambers, wherein on a side facing the switchgear cabinet (30), the partial receiving chambers are closed by a cover (16), the cover (16) forms the air inlet (14) and the at least one venting opening (13), and a sealing element (17) arranged on an outside of the cover (16) between the air inlet (14) and the venting opening (13) prevents a short circuit of the air.

2. The device arrangement in accordance with claim 1, wherein the cooling module (20) has a heat exchanger unit (22) and at least one fan unit (24) as separate components.

3. The device arrangement in accordance with claim 2, wherein the cooling device (10) has a rack put together from horizontal and vertical profiled frame elements (11, 12, 13) connected with each other in corners of the rack, compartment floors (15) are horizontally fastened on the rack for dividing the partial receiving chamber, and the cooling modules (20) are positionable on the compartment floors (15).

4. The device arrangement in accordance with claim 3, wherein at least one of the cooling module (20) and partial components of the cooling module has a structural width less than a clear opening dimension between the two vertical profiled frame elements (13) at a front of the rack.

5. The device arrangement in accordance with claim 4, wherein on a side facing away from the switchgear cabinet (30) the cooling device (10) is sealingly closed off by a wall element.

6. The device arrangement in accordance with claim 5, wherein the cooling device (20) is installed between two switchgear cabinets (30), and the partial receiving chambers are selectively brought into an air-conducting connection with the interior chambers of at least one of the switchgear cabinets (30).

7. The device arrangement in accordance with claim 6, wherein at least one of the cooling modules (20) is in spatial connection with both interiors of the switchgear cabinets (30) via air inlets (14) and venting openings (13).

8. The device arrangement in accordance with claim 7, wherein electrical built-ins (31) are server units having cooling conduit structures extending in a direction of the switchgear cabinet interior, and the venting opening (13) of the cooling conduit structure is assigned to the front of the switchgear cabinet (30), and the air inlet (14) is assigned to an area of the rear of the switchgear cabinet (30).

9. The device arrangement in accordance with claim 1, wherein the cooling module (20) has a heat exchanger unit (22) and at least one fan unit (24) as separate components.

10. The device arrangement in accordance with claim 1, wherein the cooling device (10) has a rack put together from horizontal and vertical profiled frame elements (11, 12, 13) connected with each other in corners of the rack, compartment floors (15) are horizontally fastened on the rack for dividing the partial receiving chamber, and the cooling modules (20) are positionable on the compartment floors (15).

11. The, device arrangement in accordance with claim 10, wherein at least one of the cooling module (20) and partial components of the cooling module has a structural width less than a clear opening dimension between the two vertical profiled frame elements (13) at a front of the rack.

12. The device arrangement in accordance with claim 1, wherein on a side facing away from the switchgear cabinet (30) the cooling device (10) is sealingly closed off by a wall element.

13. The device arrangement in accordance with claim 1, wherein the cooling device (20) is installed between two switchgear cabinets (30), and the partial receiving chambers are selectively brought into an air-conducting connection with the interior chambers of at least one of the switchgear cabinets (30).

14. The device arrangement in accordance with claim 1, wherein at least one of the cooling modules (20) is in spatial connection with both interiors of the switchgear cabinets (30) via air inlets (14) and venting openings (13).

15. The device arrangement in accordance with claim 1, wherein electrical built-ins (31) are server units having cooling conduit structures extending in a direction of the switchgear cabinet interior, and the venting opening (13) of the cooling conduit structure is assigned to the front of the switchgear cabinet (30), and the air inlet (14) is assigned to an area of the rear of the switchgear cabinet (30).

* * * * *